United States Patent [19]

Markovich et al.

[11] Patent Number: 5,120,339
[45] Date of Patent: Jun. 9, 1992

[54] METHOD FOR FABRICATING A LOW THERMAL EXPANSION COEFFICIENT GLASS FIBER-REINFORCED POLYMER MATRIX COMPOSITE SUBSTRATE AND COMPOSITE SUBSTRATE

[75] Inventors: Voya R. Markovich, Endwell; Shyama P. Mukherjee, Hopewell Junction; Robert R. Schaffer, Endwell; Donald P. Seraphim, Vestal, all of N.Y.

[73] Assignee: International Business Machines Corporation, Armonk, N.Y.

[21] Appl. No.: 680,363

[22] Filed: Apr. 4, 1991

[51] Int. Cl.⁵ .............................................. C03C 25/02
[52] U.S. Cl. ........................................ 65/3.1; 65/3.43;
65/18.1; 65/18.3; 65/60.3; 65/60.51; 65/901;
174/258; 427/386; 428/225; 428/241; 501/12;
501/32

[58] Field of Search ................... 501/12, 95, 32;
65/3.11, 3.43, 18.1, 18.3, 18.4, 60.2, 60.3, 60.51,
DIG. 901; 174/258; 428/241, 225; 427/96,
389.8, 386

[56] References Cited

U.S. PATENT DOCUMENTS

| | | | |
|---|---|---|---|
| 3,523,037 | 8/1970 | Chellis | 427/386 X |
| 3,811,925 | 5/1974 | Nesteruk | 65/901 X |
| 4,550,128 | 10/1985 | Chellis | 427/386 X |
| 4,597,996 | 7/1986 | Chellis | 427/386 |
| 4,762,751 | 8/1988 | Girgis | 65/3.43 X |
| 5,021,369 | 6/1991 | Ackerman et al. | 501/95 |

*Primary Examiner*—Robert L. Lindsay
*Attorney, Agent, or Firm*—Pollock, Vande Sande & Priddy

[57] ABSTRACT

A composite substrate is fabricated by applying to a glass fiber substrate a liquid sol-gel composition and then sintering the sol-gel to convert it to the glass phase. A polymeric coating is then applied.

18 Claims, No Drawings

METHOD FOR FABRICATING A LOW THERMAL EXPANSION COEFFICIENT GLASS FIBER-REINFORCED POLYMER MATRIX COMPOSITE SUBSTRATE AND COMPOSITE SUBSTRATE

DESCRIPTION

1. Technical Field

The present invention is concerned with a method for fabricating a composite substrate and is particularly concerned with fabricating glass fiber-reinforced polymer based composite substrates that have relatively low coefficients of thermal expansion. Substrates obtained by the present invention possess dielectric constants, mechanical properties and relatively low coefficients of thermal expansion such that the substrates are especially suitable as chip carriers for integrated circuit chips. In particular, substrates of the present invention have coefficients of thermal expansion that closely match the coefficient of thermal expansion of silicon integrated circuit chips, thereby, rendering the substrates suitable for the direct attachment of the chips thereto.

2. Background Art

Printed circuit composites in mass production today are based to a large extent on glass fabric. The fabric is employed to provide a manufacturing handable carrier for the polymeric insulation such as the epoxy insulation.

The exceptional strength of the glass fabric permits the fabric-polymeric insulation composite to proceed through a variety of processes that include a treating tower under tension and permits carrying the weight of the epoxy coating. The glass fabric is usually coated with a coupling agent such as a silane to facilitate producing a coherent and adherent interface with the polymeric insulation. The composite then becomes a continuum with the desirable mechanical properties. The glass fabric acts as a crack stopper. The composite is intended to provide a structure having thermal expansion properties equal to that of the subsequently employed copper circuitry. Accordingly, the composite is intended to be a mechanically intrical material that will support relatively thin platings of copper that can be thermally cycled without risk of fracture.

More recently, there has been increased interest in obtaining materials that have relatively low coefficients of thermal expansion which would act as a composite substrate for the direct attachment of integrated circuit chips thereto rather than having the chips attached to ceramic modules. The direct attachment of the chip to such a substrate would eliminate one level of packaging by matching as close as possible the coefficients of thermal expansion of the composite substrate and of the chip. In addition, minimal thermal strain will be placed on the connecting joints (e.g., solder joints) between the integrated circuit chip and the chip carrier composite substrate.

For example, the coefficient of thermal expansion of a printed circuit board fabricated with E-glass fiber reinforced epoxy matrix polymer is about 17 cm/cm/°C.$\times 10^6$. This is much too high for direct chip attachment because the CTE of silicon is about 3 cm/cm/°C.$\times 10^6$.

To some extent the coefficient of thermal expansion can be modified by modifying the composition of glass fabric comployed and/or the design of weave of the fabric. Examples of various suggestions of modified glass fabrics can be found in U.S. Pat. Nos. 4,372,347, 4,582,748, 4,591,659, 4,414,264, RE 31,124, 3,801,427, 4,569,692, 4,410,388, and 3,537,948. Although, modification of the fabric does result in lowering of the thermal expansion properties of the fabric to those of silicon, further improvement is still desirable to achieve the desirable mechanical properties such as modulus of elasticity along with the coefficient of thermal expansion.

SUMMARY OF INVENTION

In accordance with the present invention, a method for fabricating a composite substrate is provided to produce a composite substrate that has a relatively low coefficient of thermal expansion along with increased modulus of elasticity. The process of the present invention provides substrates whereby the coefficient of thermal expansion closely matches that of the integrated circuit chip as well as the copper circuitry to be subsequently deposited.

In particular, the method of the present invention is concerned with providing a substrate of glass fibers and then applying to the substrate a liquid sol-gel composition wherein the sol-gel includes metal alkoxides derived organometallic polymer precursors. Next, the sol-gel is sintered in order to convert it to the glassy phase or organically modified glassy phase (organically modified silicates). A coating containing an organic polymer is then applied.

The present invention is also concerned with the composite substrate obtained by the above process.

BEST AND VARIOUS MODES FOR CARRYING OUT INVENTION

The process of the present invention is concerned with fabricating a composite substrate having a relatively low coefficient of thermal expansion. The process of the present invention includes applying to a substrate of glass fibers a liquid sol-gel composition.

The sol-gel materials employed pursuant to the present invention are compositions containing primarily metal alkoxides and metal salts or primarily organically modified sol-gel materials. Organically modified sol-gel materials are described in H. Schmidt, "Organically Modified Silicates by the Sol-Gel Process", Belter Ceramics Through Chemistry, Eds. C. J. Brinker, D. Clark, and D. R. Ulrich, Materials Research Soc. Symposia Proc., Vol. 32, 1984, p. 327.

Discussions of sol-gel techniques can be found in Mukherjee, et al., "Glassy Thin Films and Fiberization by the Gel Route", NATO Advanced Study Institute, conference on "Glass Current Issues", Tenerife, Spain, Apr. 2–13, 1984; Mukherjee, "Sol-Gel Processes in Glass Science and Technology"; Journal of Non-Crystalline Solids, 42 (1980), 477–488, North-Holland Publishing Company; and Lewis, "Premium Ceramics From Sol-Gel", ME, Apr. 1987, pp. 49–53, and U.S. patent applications 07/193,023 abandoned and 07/385,993, now U.S. Pat. No. 4,988,646 disclosures of which are incorporated herein by reference.

The glass fiber yarn which contains a plurality of continuous glass filaments is impregnated with a sol-gel precursor. The sol-gel precursor is an organometallic (metal alkoxides) polymer solution having a relatively low viscosity.

Sol-gel impregnated glass yarns or fabrics on subsequent thermal treatment is transformed into a low CTE yarn due to the bonding action of the sol-gel precursor. The sol-gel precursor which is a silicate based material transforms into a low CTE inorganic glassy phase or organically modified (i.e.—mixed organic-inorganic) glassy phase on thermal treatment.

The sol-gel precursor acts as an interfacial "glue" in binding the individual filaments together. Since the coefficient of thermal expansion of individual filaments (e.g.—glass, see Table 1 below) is low, the restraining the movement of the filaments with low CTE gel-derived either inorganic or mixed-organic inorganic glassy phase "glue" leads to low expansion glass-fabrics which are finally impregnated with a high temperature, low dielectric constant resin to make the dielectric sheet layer.

In order to control and tailor the CTE and mechanical properties of the sol-gel coated organic polymer impregnated fabrics to the desired values, the following parameters are to be taken into account:

TABLE 1

| COMPARATIVE PROPERTIES OF GLASS TYPE FIBERS | | | | |
|---|---|---|---|---|
| | E-GLASS | S-GLASS | QUARTZ | KEVLAR 49 (X-Y DIRECTION) |
| FIBER DENSITY (G/CM$^3$) | 2.54 | 2.49 | 2.2 | 1.44 |
| TENSILE STRENGTH 10$^3$ PSI | 500 | 665 | 450 | 525 |
| MODULUS OF ELASTICITY 10$^6$ PSI | 10.5 | 12.4 | 10 | 19 |
| TEC CM/CM/°C. × 10$^5$ | 5.0 | 2.9 | 0.7 | −2 |

1. The volume fractions and the physical properties and especially the coefficient of thermal expansion and elastic modulus of the "glassy" gel phase.
2. The physical properties and especially the CTEs and elastic moduli of glass fabrics and the weaving characteristics of the fabric which control the volume fractions of glass in a fabric.
3. The physical properties and especially the CTEs and the elastic moduli and volume fractions of the impregnated organic polymer after the sol-ge impregnation.

The sol-gel compositions are usually applied at thicknesses of about 0.2 μm to about 2 μm and more typically about 0.2 μm to about 1 μm.

The sol-gel compositions contain a metal alkoxide such as tetramethoxysilane, titanium isopropoxide, trimethyl borate and tributyl borate. In addition to the metal alkoxide, the sol-gel contains water, reactive metal salt, if desired, such as $CuNo_3$, Cu-Acetate Pd-acetate to induce catalytic action for seeding, and a catalyst for the gelation reaction. Suitable catalysts include nitric acid, hydrochloric acid and acetic acid. The sol-gels are usually prepared with a molar ratio of water to silane of about 4:1 to about 20:1 and preferably about 10:1 to about 5:1. The amount of catalyst is usually about 0.0005 mol % to about 0.008 mol % typical of which is about 0.004 mol %.

The metal oxide content (e.g.—$SiO_2$, $TiO_2$ and $B_2O_3$) usually include about 3% to about 10% by weight of the metal salt and preferably about 5% to about 10% by weight of the metal oxide in ethanol solution.

The sol-gels can include an organic diluent such as an alcohol preferably ethanol act as solvent for the sol-gel.

The sol-gels can also contain organic plasticizers that are removable when subjected to elevated temperatures such as those available under the trade designation Benzoflex. These are plasticizers that are dibenzoate esters of dipropylene glycol or of polyethylene glycol. Such is usually present in amounts of up to about 20 volume percent and preferably from about 5 to about 10 volume percent.

In a typical procedure the silica sol can be prepared the partial polymerization of, for instance, tetraethoxysilane, using an ultrasonic agitator at room temperature in presence of an acid catalyst. The viscosity of such is usually about 2 to about 20 centipoise at normal room temperature.

For example, a preferred proportion of tetraethoxysilane, water and acid such as nitric acid is 70.9/28.8/0.3 volume percent, respectively.

The molar ratio of water/tetraethoxysilane is equal to 5/1. Solutions of 3%, 5%, and 10% sol-gel solutions are preferably used which refer to the percentage of grams of $SiO_2$ to 100 ml of ethanol. The silica sol thus prepared has a pH of 1.10 and a viscosity of 10 cps at room temperature.

This low pH silica remains stable for several weeks when stored in a closed container. The shelf-life is further prolonged by storing in a refrigerator. The sol-gel solution thus prepared can be doped with a small concentration of a pyrolyzable plasticizer such as Benzoflux B-988 (manufactured by Velsicol Co.) to induce plasticity or reduce brittleness during drying. Dopants can also be used to produce organically modified silicates (e.g.—ORMOSILS) to induce flexibility and to reduce brittleness in the final sol-gel treated fabrics. For instance, a small concentrations of polydimethylsiloxane solution (PDMS) can be used as a flexibilizer.

In a typical example, about 2.5 grams of PDMS is employed per 100 grams of silica.

According to one aspect of the present invention, the sol-gel compositions can include a transition metal compound which can be subsequently activated such as by a heat treatment to provide catalytic seeds for the subsequent additive plating step. The transition metal compound is typically one of copper, palladium, vanadium, ruthenium, nickel, tungsten, and molybdenum. The transition metal compound is reduced to the metal, preferably by chemical reduction, for example, with hydrogen. In this way, the metallic nuclei generated in the activation process provide catalytic properties and improved adhesion for a subsequent additive metal plating. A discussion of sol-gel containing transition metal compounds can be found in U.S. patent application Ser. No. 07/016,603 to Mukherjee et al., filed Feb. 19, 1987, now abandoned entitled, "Process For Metal Plating of Substrates," disclosure of which is incorporated herein by reference.

The copper, when employed, can be introduced into the gel system in the form of copper (II) nitrate or copper (II) ethoxide. Palladium acetyl acetonate (2,4-pentanedione) can be employed for providing the palladium into the sol-gel composition. Usually concentrations of about 5 to about 10 wt % of Cu and about 0.02 to about 0.05% of Pd are employed.

Such glass fiber reinforced plated copper composite sheets having low coefficient of thermal expansion are especially useful as power cores in the fabrication of multilayer chip carrier cards having both the dielectric layers or signal core and the power core matches in thermal expansion coefficient. Consequently, the thermal stress generated during thermal cycling can be minimized.

Hence, the present invention leads to the fabrication of multilayer composite boards which can have two types of constituent layers: low CTE (Coefficient of Thermal Expansion) Dielectric layers which will act as signal layers, or low CTE copper composite layers which can act as power cores.

The gel-impregnated fabric is either thermally heated up to 350° C. or cured in plasma of $CF_4$ and oxygen at temperatures of about 150° C. to glue together the yarns and to activate the seed. Alternatively, the seeding can be done by treating the PD-metal-free-gel-coated fabric with Pd/Sn colloidal sols. This is a conventional method of seeding for electroless plating (U.S. Pat. Nos. 4,478,883 and 4,448,804). The gel-coated and seeded fabric can then be plated with, for example, copper or nickel by electroless plating process.

The electroless coating results in thicker metal coatings on the substrate as compared to glass polymer substrates made without the sol-gel. It is believed that this is due to the fact that the sol-gel precludes, for instance, copper from penetrating within the bundles thereby allowing coating only on the surface to occur. Typical copper-coated composites prepared according to the present invention have a coefficient of thermal expansion of about $4.6 \text{ cm/cm/°C.} \times 10^6$ as compared to $11.2 \text{ cm/cm/°C.} \times 10^6$ for those not employing the sol-gel technique of the present invention.

In order to insure that the sol-gel impregnated glass fabric does not become too brittle after the sintering, it is preferred that the liquid sol-gel composition be applied to the fabric by dip-coating followed by allowing excess liquid to drip off and then hanging the fabric to allow the gel to cure. This procedure is especially important when ethanol is present in the sol-gel composition in order to control the rate of ethanol evaporation from the fabric. It has been determined that a high rate of ethanol evaporation from the fabric will bring about drying stresses within the fabric which will ultimately contribute to brittleness.

Typical glass fibers that can be employed include E-glass, S-glass and fused quartz. The preferred glass fibers include S-glass fibers. Examples of weaving arrangements include plain weave and preferably basket weave. Basket weave is preferred since it provides a higher portion of glass in the composite and thus gives a lower value of coefficient of thermal expansion as compared to the coefficient of thermal expansion of a plain weave fabric composite. Typically, the glass fiber substrate is about 3 to about 5 mils thick and preferably about 3 to about 4 mils thick typical of which is about 4 mils.

When employing E-glass or S-glass it is preferred that thermal treatments of the glass above temperatures of 120° C. before treatment with the sol-gels can be avoided, since such higher temperatures tend to render the fabrics somewhat brittle. With quartz fabrics, this brittleness is not noticeable.

According to preferred aspects of the present invention, after the glass fabric is dip-coated and dried in air at ambient temperatures, such is maintained in a saturated ethanol-vapor chamber for about 8 to about 24 hours typical of which is about 24 hours in order to permit the gel to continue the process of polymerization and densification without any evaporation of the ethanol occurring.

The coated glass fabric is typically in rolled form for placement in the ethanol-vapor chamber. Subsequent to this, the fabric samples are then dried such as in a box oven about 4 to about 24 hours typical of which is about 24 hours at temperatures between about 40° C. and about 60° C. and preferably about 50° C. to aid in the removal of the ethanol and to densify the gel layer.

The coated fabric is then sintered using a controlled heating rate of about about 10° C. to about 50° C. per hour and preferably about 10° C. per hour. According to preferred aspects of the present invention, the fabric is heated to about 300° C. to 400° C., typically about 350° C. for about 1 to about 4 hours in air.

The thermal treatment can be carried out in a conventional box ashing furnace or preferably in an infrared furnace.

In order to achieve a more uniform heating and air flow an Infrared Belt furnace is used. The fabrics are heat treated in unrolled form on a moving belt in the furnace having a continuous air flow. The IR belt furnace manufactured by the Radient Technolgy Corporation has 16 feet long and 15 inches wide steel mesh as a carrier. The sample is fed through four heating zones of fixed length (varying from 10 inches to 20 inches) and the rest for cooling. The zone temperatures as well as the belt speed are varied conveniently to get the best conditions for the organic removal.

Typical temperatures used in the IR heating zones are 100° C. for zone 1, 350° C. for zones 2, 3 and 4 employing belt speeds ranging from 2 inches/minute to 10 inches/minute.

After the sintering, the structure is then coated with a polymeric composition preferably of a thermosetting polymer to provide the desired insulation for the composite substrate. Examples of suitable polymeric compositions include the epoxy compositions disclosed in U.S. Pat. Nos. 4,550,128, 3,523,037 and 4,597,996. The preferred polymer composition contain cyanate resins such as Interez in a solvent such as methylethylketone.

The polymer coating is typically about 0.4 to about 0.5 volume fraction of the whole laminate.

The fabrics can be impregnated in a continuous way, fed through a roll as it is done in normal impregnation of fabrics without the gel coating. The impregnated fabrics are partially cured in air at a temperature about 120° C. to about 150° C. The final curing can be done during lamination in nitrogen atmosphere or under vacuum at about 320° C. to about 360° C. for 1 hour. The multilayer boards/cards can be fabricated by the lamination of several partially cured layers.

If desired, the substrate can be laminated onto other substrates as well as being interposed between the above electrically conductive patterns present in the temporary support layers.

The laminating can be carried out by pressing together the desired structure in a preheated laminating press at a predetermined pressure and temperature as, for example, about 300 psi at about 200° C. for about 30 minutes followed by increasing the temperature to about 300° C. to 325° C. and maintaining at that temperature for another 30 minutes.

The following non-limiting examples are presented to further illustrate the present invention.

EXAMPLE 1

A sol-gel composition is prepared by adding a 0.3 weight percent nitric acid aqueous solution to tetraethoxysilane and mixing for about 30 minutes. The gel is mixed in one-half molar tetraethoxysilane batches adding about five mols of water and the nitric acid to bring the final pH of the system to about 1.5. The nitric acid acts as a catalyst for the hydrolysis reaction and as such proceeds, ethanol is liberated which allows for the formation of a homogenous sol-gel solution. The viscosity of the sol-gel is about 10 centipoise. S-glass fibers of about five mils thickness and previously fabricated in a basket weave are dip-coated into the sol-gel. The fabric is then removed from the sol-gel and excess liquid is permitted to drip off followed by hanging the fabric to allow the gel to initially cure. Such is hung in a saturated-ethanol-vapor chamber for about 24 hours and then placed in a forced-air oven for another 24 hours at a temperature of about 50° C.

The fabric is then fired in an ashing furnace with air flowing using a controlled heating rate of between 1° C. and 2° C. per minute to raise the temperature to about 360° C. where it is maintained for about four hours. Next, the fabric is coated with a composition of Interez cyanate polymer and cured at a temperature of about 120° C. to about 150° C. for about 20 to about 30 minutes. The sol-gel coated fabric thus obtained is impregnated with Interez cyanate resin and subsequently laminated.

The sol-gel coated fabric after 360° C. heat treatment is catalyzed for electroless plating by dipping in a palladium-tin colloid composition and then subjected to a standard electroless copper additive plating bath. The copper plated composite has a coefficient of thermal expansion of about 4.6 cm/cm/°C.×10⁶. The copper layer is about 23 microns thick.

COMPARATIVE EXAMPLE 2

Example 1 is repeated except that the glass fabric is coated with the Interez polymer without the intermediate solled-gel application. The Interez glass fiber composite has a coefficient of thermal expansion of 6.3 cm/cm/°C.×10⁶. The copper-coated composite has a coefficient of thermal expansion of 11.2 cm/cm/°C.×10⁶. The thickness of the copper layer is about 18 microns.

A comparison of Example 1 with Example 2 shows that the use of the sol-gel application according to the present invention results in significantly reduced coefficient of thermal expansion. Also, the comparison of Example 1 with Example 2 shows that the amount of copper is significantly increased by following the technique of the present invention.

What is claimed is:

1. A method for fabricating a composite substrate which comprises:
   A) Providing a substrate of glass fibers;
   B) Applying to said substrate a liquid sol-gel wherein said sol-gel comprises a metal alkoxide;
   C) Sintering said sol-gel to convert such to the glass phase or mixed organic-inorganic gel phase; and
   D) Then applying a coating of a polymer to the composite obtained in step C).

2. The method of claim 1 wherein said substrate of glass fibers are woven glass fibers.

3. The method of claim 1 wherein said substrate of glass fibers are glass fibers in a basket weave.

4. The method of claim 1 wherein the liquid sol-gel is applied to the said substrate of glass fibers by dipping the substrated glass fibers into the liquid sol-gel.

5. The method of claim 1 wherein said sol-gel is sintered at temperatures of about 320° C. to about 360° C.

6. The method of claim 1 wherein said sol-gel is sintered at temperatures of about 400° C.

7. The method of claim 1 wherein said polymer is a cyanate polymer.

8. The method of claim 1 wherein a coating of copper is subsequently applied to the composite substrate.

9. The method of claim 1 wherein said sol-gel contains a transition metal compound.

10. The method of claim 9 wherein said transition metal compound is a copper compound.

11. The method of claim 9 wherein said transition metal compound is a palladium compound.

12. The method of claim 1 wherein said sol-gel has a viscosity of about 10 cps at room temperature.

13. The method of claim 17 wherein said alkoxysilane is tetraethoxysilane o tetramethoxysilane.

14. The method of claim 1 wherein said metal alkoxide is selected from the group of alkoxide of titanium, boron, and silica.

15. A composite substrate prepared by the process of claim 1.

16. The method of claim 1 wherein sol-gel is a silica based sol-gel.

17. The method of claim 1 wherein said metal alkalide is an alkolysilane.

18. The method of claim 1 wherein said polymer is a thermosetting polymer.

* * * * *